United States Patent
Baker

(10) Patent No.: US 7,792,502 B2
(45) Date of Patent: Sep. 7, 2010

(54) METHOD AND SYSTEM FOR MEASURING AND OPTIMIZING INTEGRATED ANTENNA PERFORMANCE

(75) Inventor: Thomas Baker, Manhattan Beach, CA (US)

(73) Assignee: Broadcom Corporation, Irvine, CA (US)

(*) Notice: Subject to any disclaimer, the term of this patent is extended or adjusted under 35 U.S.C. 154(b) by 581 days.

(21) Appl. No.: 11/832,609

(22) Filed: Aug. 1, 2007

(65) Prior Publication Data
US 2008/0233881 A1    Sep. 25, 2008

Related U.S. Application Data

(60) Provisional application No. 60/895,665, filed on Mar. 19, 2007.

(51) Int. Cl.
*H03C 1/62* (2006.01)
*H04K 3/00* (2006.01)

(52) U.S. Cl. .................. 455/115.2; 455/67.14; 455/69; 455/423

(58) Field of Classification Search ............. 455/67.11, 455/67.14, 69, 115.2, 423–424, 522, 552.1, 455/553.1
See application file for complete search history.

(56) References Cited

U.S. PATENT DOCUMENTS

| 6,944,427 B2 * | 9/2005 | Haub et al. ................. 455/63.1 |
| 7,177,663 B2 * | 2/2007 | Axness et al. ............. 455/552.1 |
| 2004/0171408 A1 * | 9/2004 | Maruta ..................... 455/562.1 |

* cited by examiner

*Primary Examiner*—Lee Nguyen
(74) *Attorney, Agent, or Firm*—McAndrews Held & Malloy, Ltd.

(57) ABSTRACT

Methods and systems for measuring and optimizing integrated antenna performance are disclosed and may include transmitting FM signals over a range of frequencies utilizing one or more antenna configurations. The FM transmitter may be calibrated based on a signal received by one of a plurality of wireless protocol receivers in the wireless device. The wireless device may include one or more other corresponding transmitters that utilize other wireless protocols. The transmitted FM signals may be received by a test set, which may then transmit a signal utilizing a different wireless protocol for adjusting the FM transmitter. The frequency of the transmitted FM signals may be varied utilizing a tunable oscillator, and the antenna configurations may be adjusted accordingly by impedance matching them to the FM transmitter. The FM transmitter and FM receiver and the tunable oscillator may be integrated within a single chip.

30 Claims, 9 Drawing Sheets

METHOD AND SYSTEM FOR MEASURING AND OPTIMIZING INTEGRATED ANTENNA PERFORMANCE

CROSS-REFERENCE TO RELATED APPLICATIONS/INCORPORATION BY REFERENCE

This application makes reference to and claims priority to U.S. Provisional Application Ser. No. 60/895,665, filed on Mar. 19, 2007, which is hereby incorporated herein by reference in its entirety.

This application also makes reference to:

U.S. patent application Ser. No. 11/832,598 filed on even date herewith;

U.S. patent application Ser. No. 11/832,590 filed on even date herewith;

U.S. patent application Ser. No. 11/832,468 filed on even date herewith; and

U.S. patent application Ser. No. 11/832,488 filed on even date herewith.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for measuring and optimizing integrated antenna performance.

BACKGROUND OF THE INVENTION

With the increasing popularity of various wireless standards and technologies, there is a growing demand to provide a simple and complete solution for wireless communications applications. In this regard, electronics manufacturers are increasingly attempting to incorporate multiple wireless technologies into a single portable electronic device.

Although desirable to users, incorporating multiple wireless communication technologies into devices such as wireless handsets may pose problems in terms of cost and complexity. In this regard, combining a plurality of wireless technologies into a portable electronic device may require separate processing hardware and/or separate processing software. Moreover, coordinating the reception and/or transmission of data to and/or from the portable electronic device may require significant processing overhead that may impose certain operation restrictions and/or design challenges. For example, Bluetooth and Wireless LAN may pose certain coexistence problems caused by the close proximity of the Bluetooth and WLAN transceivers.

Furthermore, simultaneous use of a plurality of radios in a handheld communication device may result in significant increases in power consumption. Accordingly, the transmission of these multiple wireless protocol signals may require novel transmitter and receiver designs to share components within the device and optimize power usage.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for wireless communication, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for measuring and optimizing integrated antenna performance. Exemplary aspects of the invention may comprise transmitting FM radio signals over a range of frequencies utilizing one or more antenna configurations. The FM radio transmitter may be calibrated based on a signal received by the wireless device via one of the plurality of receivers that utilizes the other wireless protocols. The wireless device may include one or more other corresponding transmitters that utilize other wireless protocols. The transmitted FM radio signals may be received by a test set comprising an FM radio receiver and one or more corresponding transmitters that utilize other wireless protocols. The signal received at the wireless device via one of the one or more receivers is generated at the test set via the one or more corresponding transmitters that utilize other wireless protocols. The frequency of the transmitted FM radio signals may be varied over at least a portion of the range of frequencies utilizing a tunable oscillator, and the one or more antenna configurations may be varied, based on the variation of the frequency of the transmitted FM radio signals. The antenna configurations may be impedance matched to the FM radio transmitter over the range of frequency of the transmitted FM radio signals by adjusting a capacitive and/or inductive load. The FM radio transmitter, FM radio receiver and the tunable oscillator may be integrated within a single chip.

Figure 1A:
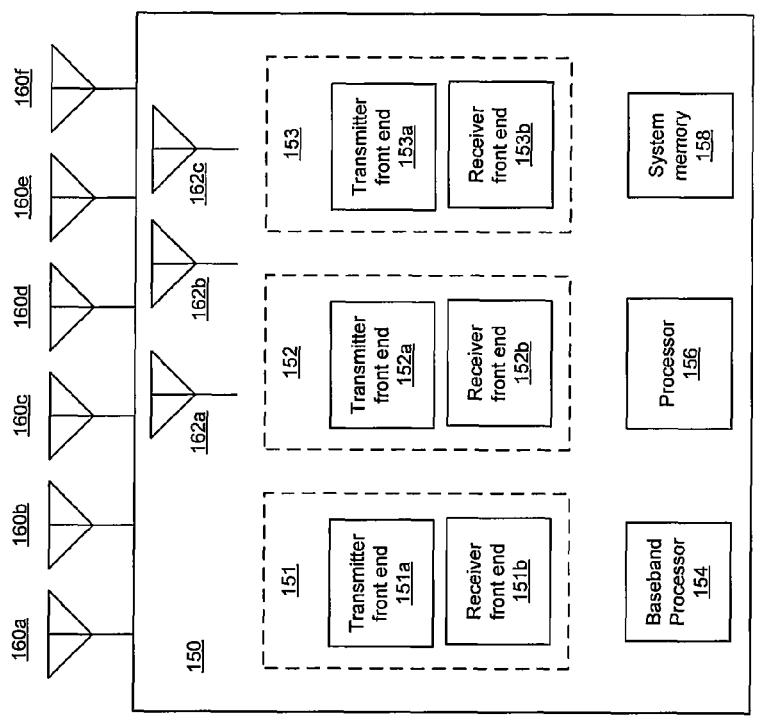
FIG. 1A is a block diagram of an exemplary system that enables multi-protocol communication, in accordance with an embodiment of the invention.

FIG. 1A is a block diagram of an exemplary system that enables multi-protocol communication, in accordance with an embodiment of the invention. Referring to FIG. 1A, there is shown a mobile terminal 150 comprising a plurality of transceivers 151, 152, and 153, a baseband processor 154, a processor 156, external antennas 160a-f, internal antennas 162a-c and system memory 158. The transceivers 151, 152, and 153 may each comprise a transmitter front end 151a, 152a, 153a, respectively, and a receiver front end 151b, 152b, 153b, respectively.

The transmitter front ends 151a, 152a, and 153a may comprise suitable circuitry, logic, and/or code that may be adapted to process and transmit RF signals. In an embodiment of the invention, the transmitter and receiver front ends for each wireless protocol may be integrated on a single chip. In another embodiment of the invention, each of the transceivers may be integrated on a single chip.

The external antennas 160a-f and the internal antennas 162a-c may comprise antennas that may be used for different wireless protocols, such as Bluetooth, NFC, WLAN and FM, for example. The internal antennas 162a-c may each comprise any metal component within the wireless communication device that may act as an antenna. One or more of the antennas may be selected to transmit and/or receive wireless signals. In an embodiment of the invention, a plurality of combinations of selected antennas may be switched on, and received signals may be measured and compared to assess the optimum antenna configuration at a particular frequency.

The transmitter front ends 151a, 152a, and 153a may receive baseband signals communicated by a baseband processor, such as, for example, the baseband processor 154. The signals may then be, for example, filtered, amplified, upconverted, and/or modulated for transmission. The baseband signal may be analog or digital depending on the functionality of the transmitter front end 151a, 152a, or 153a and the baseband processor 154.

The receiver front ends 151b, 152b, and 153b may comprise suitable circuitry, logic, and/or code that may be adapted to receive and process RF signals. The receiver front ends 151b, 152b, and 153b may amplify, filter, down-convert, and/or demodulate the received signals to generate a baseband signal. The baseband signal may be analog or digital depending on the functionality of the receiver front end 151b, 152b, or 153b and the baseband processor 154.

The baseband processor 154 is depicted as a single block for the sake of simplicity, however, the invention need not be so limited. For example, other embodiments of the invention may comprise a plurality of baseband processors for processing signals to and/or from the transceivers 151, 152, and 153.

The baseband processor 154 may comprise suitable circuitry, logic, and/or code that may be adapted to process received baseband signals from the receiver front ends 151b, 152b, and 153b. The baseband processor 154 also may comprise suitable logic, circuitry, and/or code that may be adapted to process a baseband signal for communication to the transmitter front ends 151a, 152a, and 153a.

The processor 156 may comprise suitable logic, circuitry, and/or code that may be adapted to control the operations of the transceivers 151, 152, and 153 and/or the baseband processor 154. For example, the processor 156 may be utilized to update and/or modify programmable parameters and/or values in a plurality of components, devices, and/or processing elements in the transceivers 151, 152, and 153 and/or the baseband processor 154. Control and/or data information may also be transferred to and/or from another controller and/or processor in the mobile terminal 150 to the processor 156. Similarly, the processor 156 may transfer control and/or data information to another controller and/or processor in the mobile terminal 150.

The processor 156 may utilize the received control and/or data information to determine a mode of operation for the transceivers 151, 152, and/or 153. For example, the processor 156 may control each of the receiver front ends 151b, 152b, and 153b to receive RF signals at a specific frequency. Similarly, the processor 156 may control each of the transmitter front ends 151a, 152a, and 153a to transmit RF signals at a specific frequency. The processor 156 may also adjust a specific gain for a variable gain amplifier, and/or adjust filtering characteristics for a filter. Moreover, a specific frequency selected and/or parameters needed to calculate the specific frequency, and/or the specific gain value and/or the parameters needed to calculate the specific gain, may be stored in the system memory 158 via the processor 156. This information stored in system memory 158 may be transferred to the receiver front end 152 from the system memory 158 via the processor 156. The system memory 158 may comprise suitable circuitry, logic, and/or code that may be adapted to store a plurality of control and/or data information, including parameters needed to calculate frequencies and/or gain, and/or the frequency value and/or gain value.

The wireless protocols transmitted and received by the mobile terminal 150 may comprise FM, WLAN, Bluetooth and near field communication (NFC), for example. The size of a system, such as a cellular phone with multi-protocol capability, may be greatly reduced if the radio functions for these protocols may be integrated onto a single chip. In addition, integrating a transmitter and a receiver for a particular wireless protocol on a single chip may enable configuration, calibration and performance optimization of a transceiver. In particular, the calibration of FM antennas may be difficult, due to loading effects. Any device that may be coupled to an FM transmitter may effect the tuning characteristics of the device. Thus, it is highly advantageous to integrate on-chip calibration capabilities for an FM transmitter and receiver.

Figure 1B:
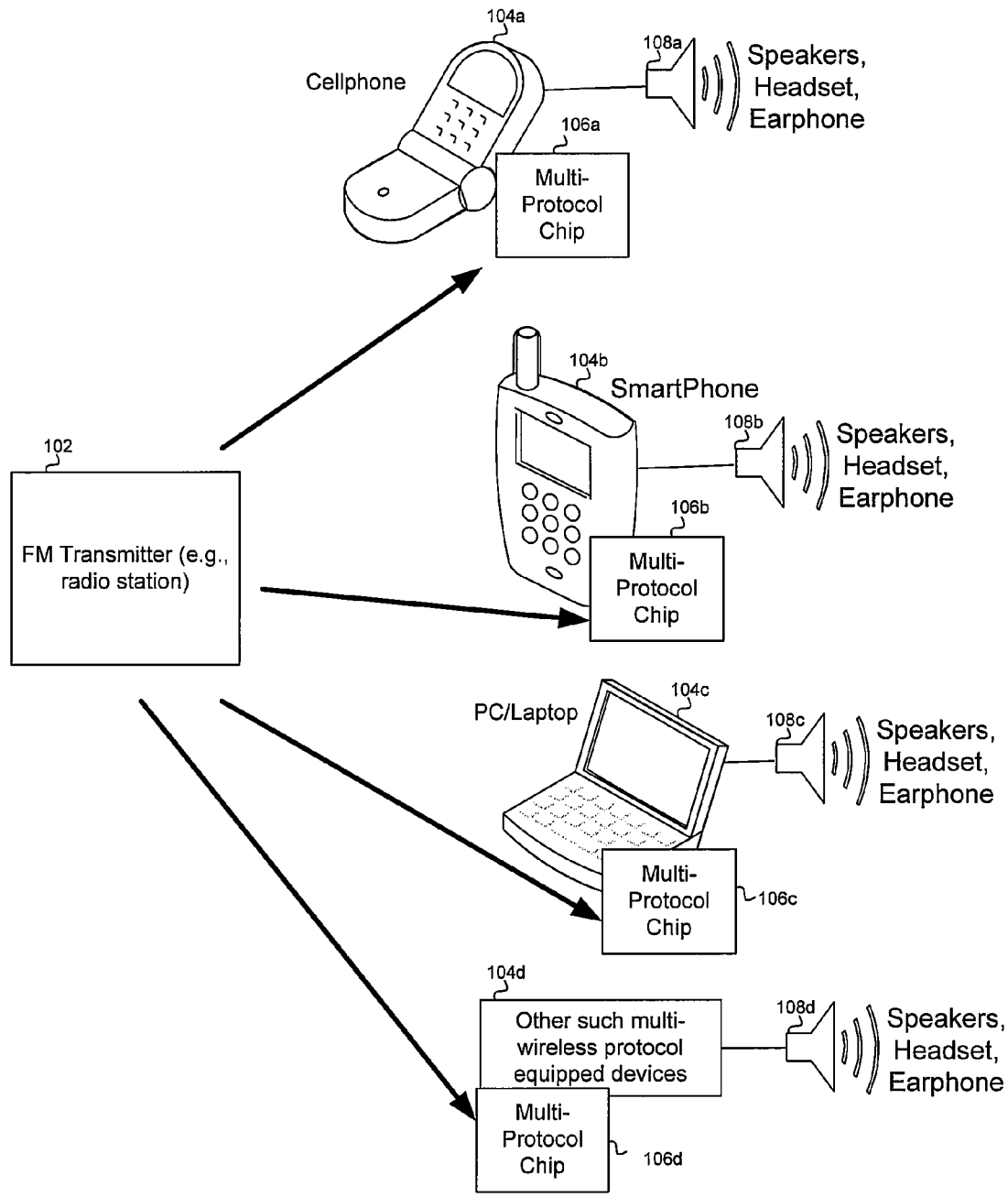
FIG. 1B is a block diagram of an exemplary FM transmitter that communicates with handheld devices that utilize a single chip with an integrated multi-wireless protocol transmitter and receiver, in accordance with an embodiment of the invention.

FIG. 1B is a block diagram of an exemplary FM transmitter that communicates with handheld devices that utilize a single chip with an integrated multi-wireless protocol transmitter and receiver, in accordance with an embodiment of the invention. Referring to FIG. 1B, there is shown an FM transmitter 102, a cellular phone 104a, a smart phone 104b, a computer 104c, and an exemplary multi-wireless protocol equipped device 104d. The FM transmitter 102 may be implemented as part of a radio station or other broadcasting device, for example. Each of the cellular phone 104a, the smart phone 104b, the computer 104c, and the exemplary multi-wireless protocol equipped device 104d may comprise a single chip 106*a*, 106*b*, 106*c* and 106*d* with multi-protocol transmitters and receivers. In an exemplary embodiment of the invention, the single chip 106 may comprise FM and Bluetooth (BT) transmitters and receivers, although the invention is not so limited. Accordingly, any number of wireless protocol transmitters and receivers may be integrated on-chip, depending on system requirements and/or size of the chip die. The FM transmitter 102 may enable communication of FM audio data to the devices shown in FIG. 1B by utilizing the single chip 106*a*, 106*b*, 106*c* and 106*d* in each device. Each of the devices in FIG. 1B may comprise and/or may be communicatively coupled to a listening device 108 such as a speaker, a headset, or an earphone, for example.

The cellular phone 104*a* may be enabled to receive an FM transmission signal from the FM transmitter 102. The user of the cellular phone 104*a* may then listen to the transmission via the listening device 108. The cellular phone 104*a* may comprise a "one-touch" programming feature that enables pulling up specifically desired broadcasts, like weather, sports, stock quotes, or news, for example. The smart phone 104*b* may be enabled to receive an FM transmission signal from the FM transmitter 102. The user of the smart phone 104*b* may then listen to the transmission via the listening device 108.

The computer 104*c* may be a desktop, laptop, notebook, tablet, and/or a PDA, for example. The computer 104*c* may be enabled to receive an FM transmission signal from the FM transmitter 102. The user of the computer 104*c* may then listen to the transmission via the listening device 108. The computer 104*c* may comprise software menus that configure listening options and enable quick access to favorite options, for example. In one embodiment of the invention, the computer 104*c* may utilize an atomic clock FM signal for precise timing applications, such as scientific applications, for example. While a cellular phone, a smart phone, computing devices, and other devices are shown in FIG. 1B, the single chip 106 may be utilized in a plurality of other devices and/or systems that receive and use multiple wireless protocols such as Bluetooth, NFC, WLAN, RFID and FM signals, for example.

Figure 1C:
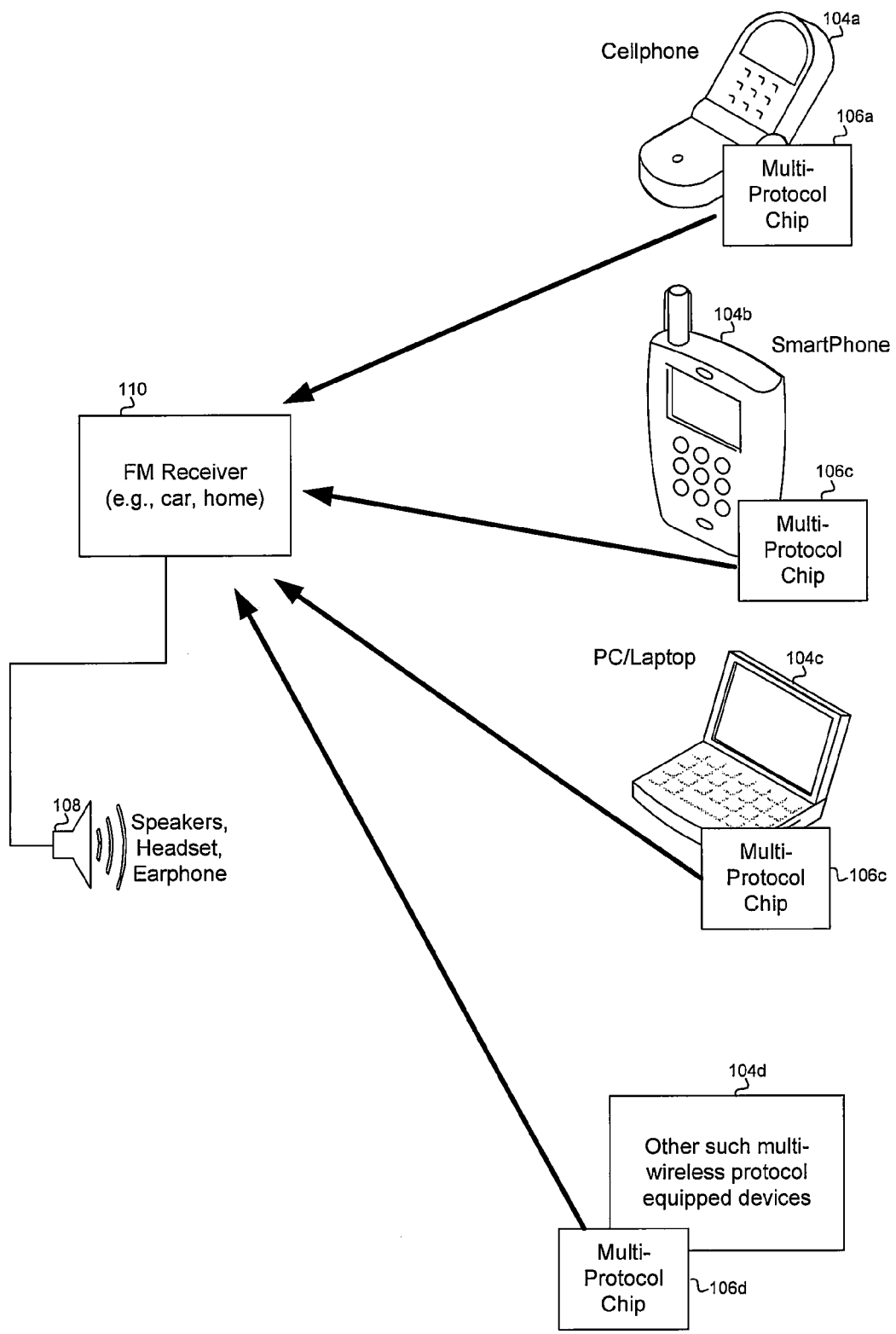
FIG. 1C is a block diagram of an exemplary FM receiver that communicates with handheld devices that utilize a single chip with an integrated multi-wireless protocol transmitter and receiver in accordance with an embodiment of the invention.

FIG. 1C is a block diagram of an exemplary FM receiver that communicates with handheld devices that utilize a single chip with an integrated multi-wireless protocol transmitter and receiver in accordance with an embodiment of the invention. Referring to FIG. 1C, there is shown an FM receiver 110, the cellular phone 104*a*, the smart phone 104*b*, the computer 104*c*, and the exemplary multi-wireless protocol equipped device 104*d*. In this regard, the FM receiver 110 may comprise and/or may be communicatively coupled to a listening device 108. A device equipped with the an integrated FM transmitter and FM receiver, such as the single chip 106*a*, 106*b*, 106*c* or 106*d*, may be able to transmit or broadcast its respective signal to a "deadband" of an FM receiver for use by the associated audio system. For example, a cellphone or a smart phone, such as the cellular phone 104*a* and the smart phone 104*b*, may transmit a telephone call for listening over the audio system of an automobile, which may comprise the FM receiver 110 and the speakers 108, via usage of a deadband area of the car's FM stereo system. This may provide a universal capability to use this feature with all automobiles equipped simply with an FM radio with few, if any, other external FM transmission devices or connections being required.

In another example, a computer, such as the computer 104*c*, may comprise an MP3 player or another digital music format player and may broadcast a signal to the deadband of the FM receiver 110 which may be part of a home stereo system. The music on the computer 104*c* may then be listened to on a standard FM receiver, such as the FM receiver 110, with few, if any, other external FM transmission devices or connections. While a cellular phone 104*a*, a smart phone 104*b*, and computing device 106*c* are shown, a single chip that combines an FM transmitter and an FM receiver may be utilized in a plurality of other devices and/or systems that receive and use an FM signal.

In an embodiment of the invention, the antennas for the FM transmitter and receiver may require calibration for optimum signal strength and accurate channel selection. Due to the high sensitivity of FM antennas to coupled electronics and/or wiring, or even proximity to metal equipment, it is desirable to incorporate calibration capability within the wireless device. In addition, due to the wide variation in wireless device size and component layout within the device, an FM transmitter/receiver may be configured to be configurable for a wide array of antennas.

Figure 1D:
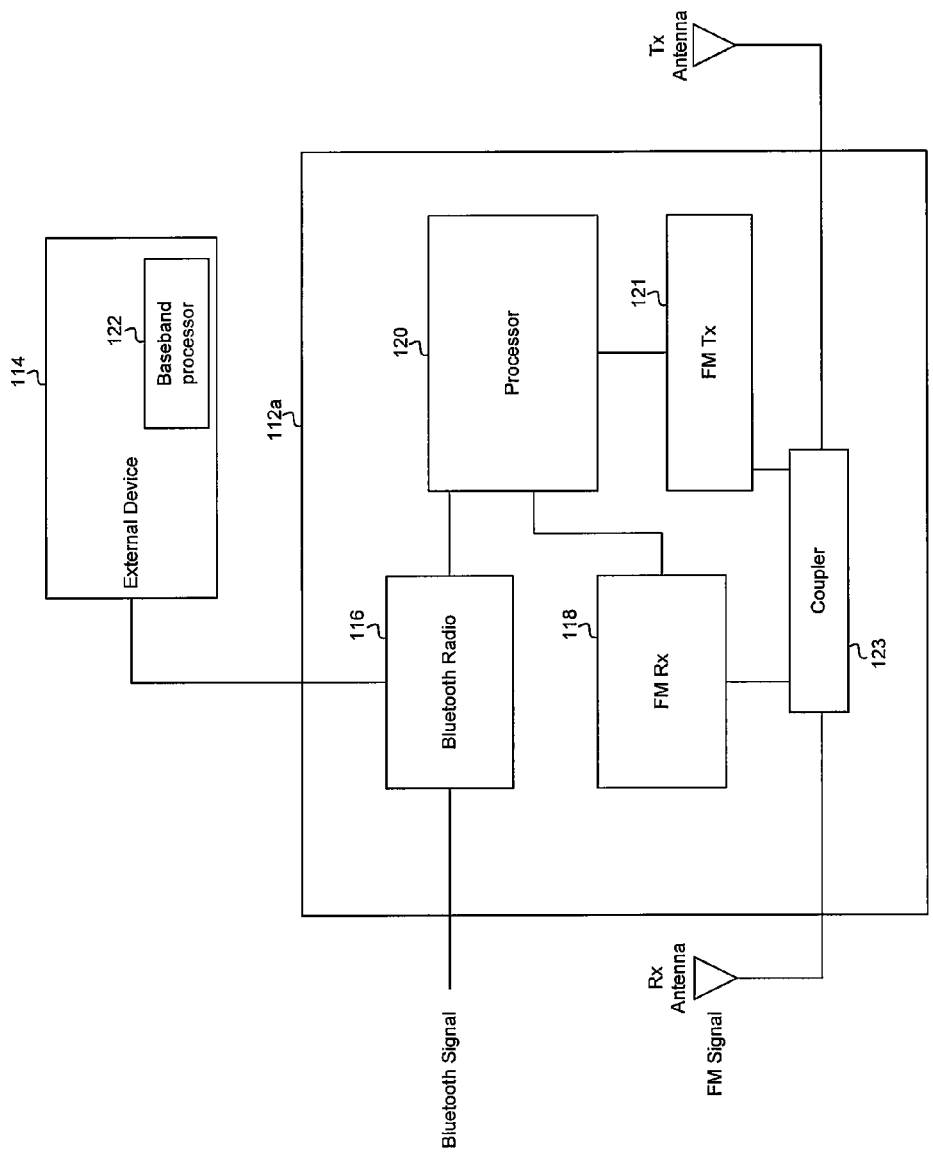
FIG. 1D is a block diagram of an exemplary single chip with integrated Bluetooth and FM Tx and FM Rx that supports FM processing and an external device that supports Bluetooth processing, in accordance with an embodiment of the invention.

FIG. 1D is a block diagram of an exemplary single chip with integrated Bluetooth and FM Tx and FM Rx that supports FM processing and an external device that supports Bluetooth processing, in accordance with an embodiment of the invention. Referring to FIG. 1D, there is shown a single chip 112*a* that supports Bluetooth and FM Tx and Fm Rx operations and an external device 114. The single chip 112*a* may comprise an integrated Bluetooth radio 116, an integrated FM Rx 118, an integrated processor 120, a coupler 123 and an FM transmitter (Tx) 121. The Bluetooth radio 116 may comprise suitable logic, circuitry, and/or code that enable Bluetooth signal communication via the single chip 112*a*. In this regard, the Bluetooth radio 116 may support processing, playback and communication of audio signals. The FM radio may comprise suitable logic, circuitry, and/or code that enable FM signal communication via the single chip 112*a*.

The integrated processor 120 may comprise suitable logic, circuitry, and/or code that may enable processing of the FM data received by the FM Rx 118. Moreover, the integrated processor 120 may enable processing of FM data to be transmitted by the FM Rx 118 when the FM Rx 118 comprises transmission capabilities. The external device 114 may comprise a baseband processor 122. The baseband processor 122 may comprise suitable logic, circuitry, and/or code that may enable processing of Bluetooth data received by the Bluetooth radio 116. Moreover, the baseband processor 122 may enable processing of Bluetooth data to be transmitted by the Bluetooth radio 116. In this regard, the Bluetooth radio 116 may communicate with the baseband processor 122 via the external device 114. The Bluetooth radio 116 may communicate with the integrated processor 120. The FM transmitter 121 may comprise suitable logic, circuitry, and/or that may enable transmission of FM signals via appropriate broadcast channels, for example.

The coupler 123 may comprise suitable circuitry, logic and/or code for coupling the Rx and Tx antennas to the FM Rx 118 and the FM Tx 121. In this manner, each, or both antennae may be utilized to transmit and/or receive FM signals. An externally measured maximum transmit signal swept over the desired frequency of operation may be utilized to determine an optimum antenna configuration.

Figure 1E:
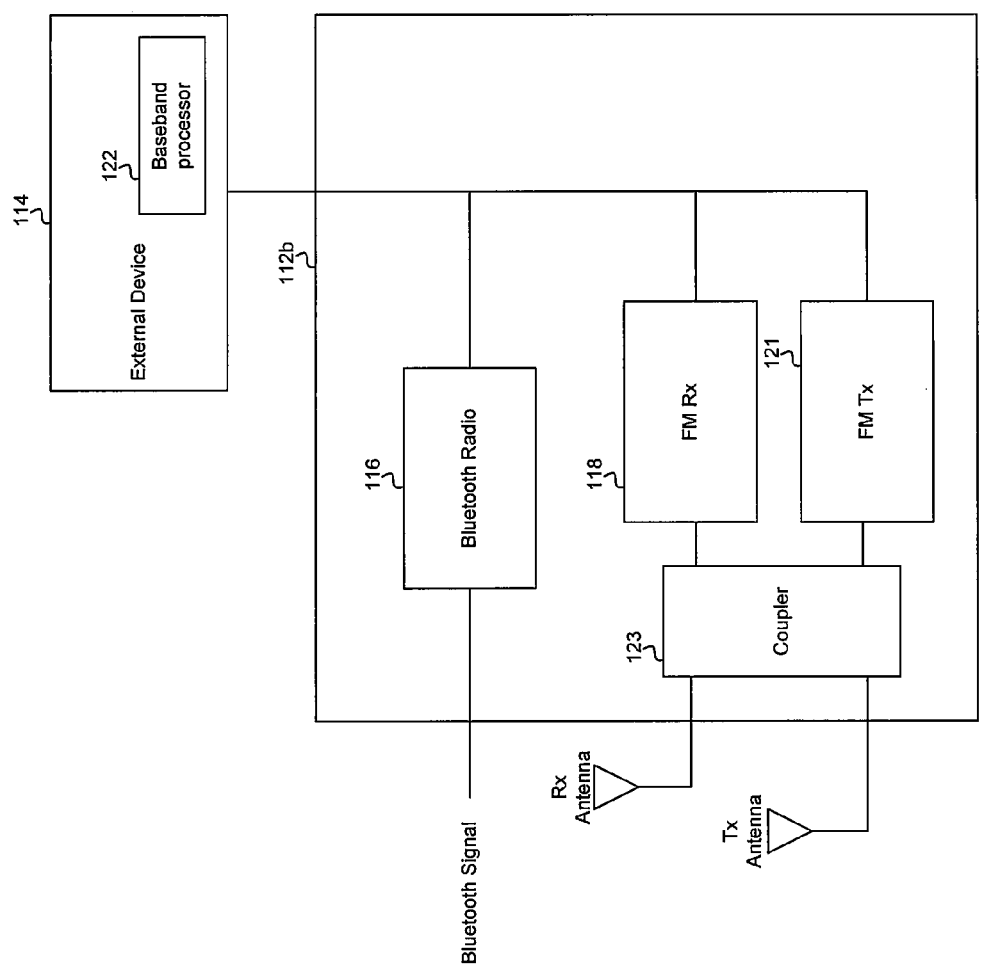
FIG. 1E is a block diagram of an exemplary single chip with integrated Bluetooth and FM radios and an external device that supports Bluetooth and FM processing, in accordance with an embodiment of the invention.

FIG. 1E is a block diagram of an exemplary single chip with integrated Bluetooth and FM radios and an external device that supports Bluetooth and FM processing, in accordance with an embodiment of the invention. Referring to FIG. 1D, there is shown a single chip 112*b* that supports Bluetooth and FM radio operations and an external device 114. The single chip 112*b* may comprise the Bluetooth radio 116, an FM Rx 118, a couple 123 and an FM Tx 121. The Bluetooth radio 116 and/or the FM Rx 118 and FM Tx 121 may be integrated into the single chip 112b. The external device 114 may comprise a baseband processor 122.

The baseband processor 122 may comprise suitable logic, circuitry, and/or code that may enable processing of Bluetooth data received by the Bluetooth radio 116 and/or processing of Bluetooth data to be transmitted by the Bluetooth radio 116. In this regard, the Bluetooth radio 116 may communicate with the baseband processor 122 via the external device 114. Moreover, the baseband processor 122 may comprise suitable logic, circuitry, and/or code that may enable processing of the FM data received by the FM Rx 118. The baseband processor 122 may enable processing FM data to be transmitted by the FM Tx 121. In this regard, the FM Rx 118 and FM Tx 121 may communicate with the baseband processor 122 via the external device 114. The coupler may be substantially similar to the coupler 123 described with respect to FIG. 1D, and may be enabled to select antennas for transmission and reception, such that either antenna may be used for transmission and/or reception. An optimum configuration may be determined by measuring a maximum transmit signal strength and receiving a feedback via another wireless protocol, such as Bluetooth, for example, to tune and calibrate the FM Tx 121.

Figure 1F:
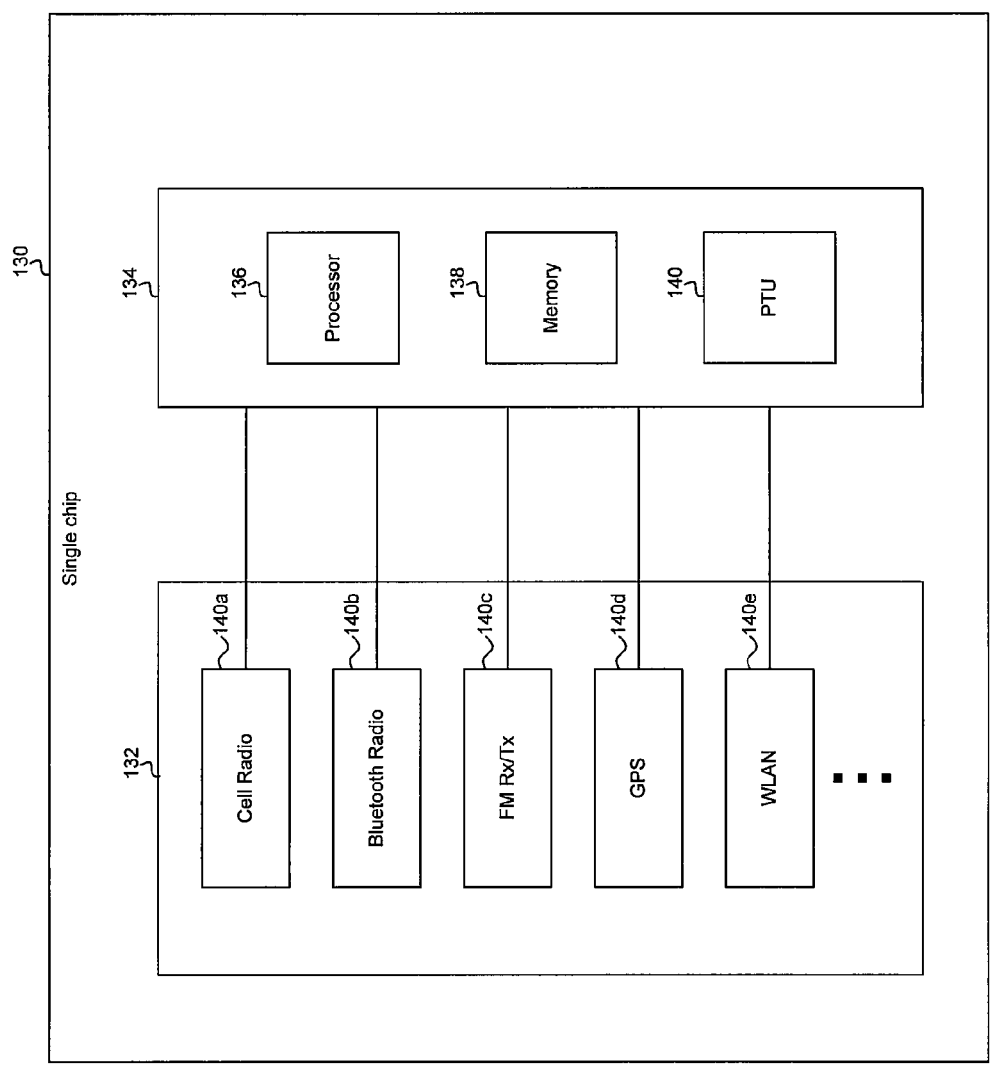
FIG. 1F is a block diagram of an exemplary single chip with multiple integrated radios that supports radio data processing, in accordance with an embodiment of the invention.

FIG. 1F is a block diagram of an exemplary single chip with multiple integrated radios that supports radio data processing, in accordance with an embodiment of the invention. Referring to FIG. 1E, there is shown a single chip 130 that may comprise a radio portion 132 and a processing portion 134. The radio portion 132 may comprise a plurality of integrated radios. For example, the radio portion 132 may comprise a cell radio 140a that supports cellular communications, a Bluetooth radio 140b that supports Bluetooth communications, an FM receive and transmit (Rx/Tx) radio 140c that supports FM communications, a global positioning system (GPS) 140d that supports GPS communications, and/or a wireless local area network (WLAN) 140e that supports communications based on the IEEE 802.11 standards.

The processing portion 134 may comprise at least one processor 136, a memory 138, and a peripheral transport unit (PTU) 140. The processor 136 may comprise suitable logic, circuitry, and/or code that enable processing of data received from the radio portion 132. In this regard, each of the integrated radios may communicate with the processing portion 134. In some instances, the integrated radios may communicate with the processing portion 134 via a common bus, for example. The memory 138 may comprise suitable logic, circuitry, and/or code that enable storage of data that may be utilized by the processor 136. In this regard, the memory 138 may store at least a portion of the data received by at least one of the integrated radios in the radio portion 132. Moreover, the memory 138 may store at least a portion of the data that may be transmitted by at least one of the integrated radios in the radio portion 132. The PTU 140 may comprise suitable logic, circuitry, and/or code that may enable interfacing data in the single chip 130 with other devices that may be communicatively coupled to the single chip 130. In this regard, the PTU 140 may support analog and/or digital interfaces.

By integrating the FM Tx and FM Rx functions on a single chip, an optimum antenna configuration may be determined by sweeping the frequency of a transmission signal utilizing a plurality of antenna configurations, measuring the transmitted signal utilizing an external test set, and feeding back a signal via a different wireless protocol that may enable calibration and/or tuning of the FM Rx/Tx 140c.

Figure 2:
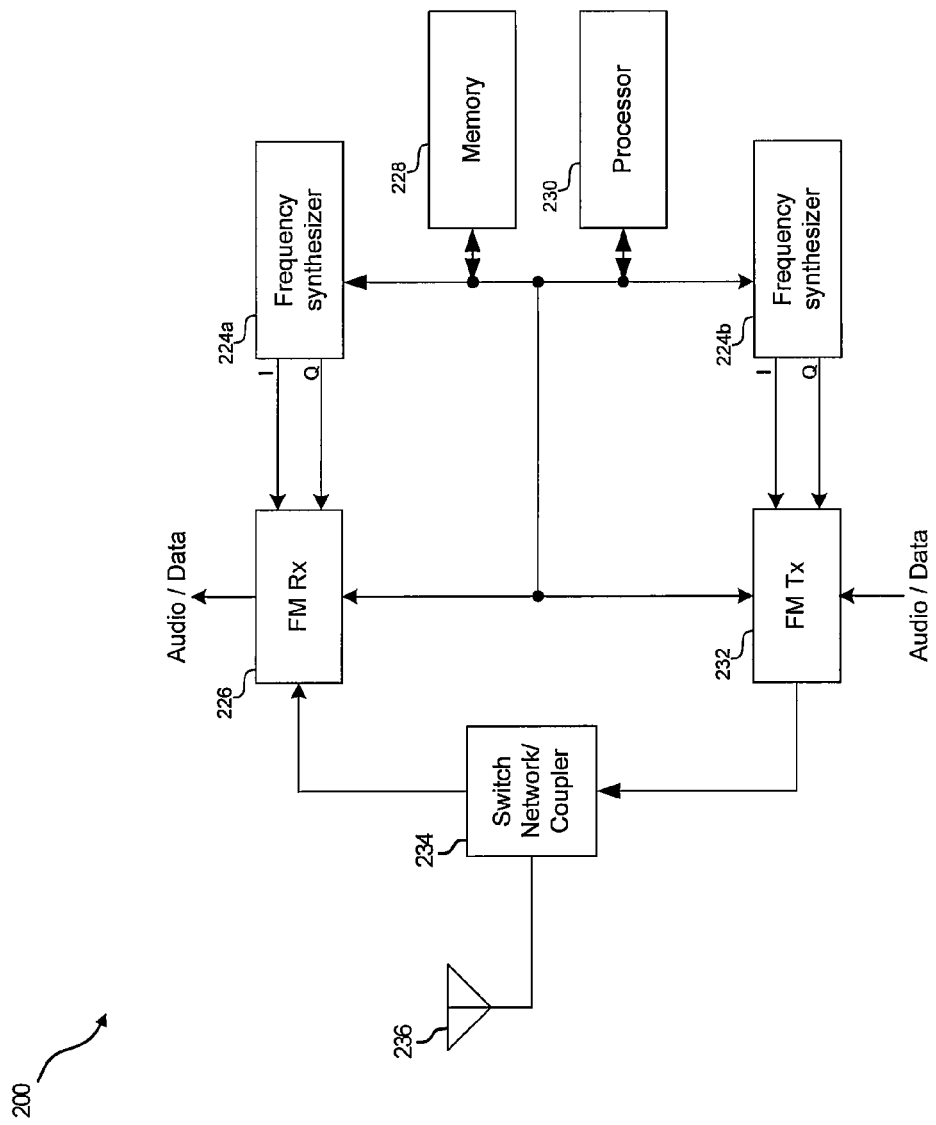
FIG. 2 is a block diagram of an exemplary system for FM transmission and reception, in accordance with an embodiment of the invention.

FIG. 2 is a block diagram of an exemplary system for FM transmission and reception, in accordance with an embodiment of the invention. Referring to FIG. 2, the radio 200 may comprise two frequency synthesizers 224a and 224b, an FM receive (Rx) block 226, a memory 228, a processor 230, a switch network/coupler 234, an antenna block 236 and an FM transmit (Tx) block 232.

The frequency synthesizers 224a and 224b may comprise suitable circuitry, logic, and/or code that may enable generation of fixed or variable frequency signals. For example, the frequency synthesizers 224a and 224b may each comprise one or more direct digital frequency synthesizers, along with a clock source, such as a Bluetooth or RFID phase-locked loop (PLL) clock generator.

The memory 228 may comprise suitable circuitry, logic, and/or code that may enable storing information. In this regard, the memory 228 may, for example, enable storing information utilized for controlling and/or configuring the frequency synthesizers 224a and 224b. For example, the memory 228 may store the value of state variables that may be utilized to control the frequency output by each of the frequency synthesizers 224a and 224b. Additionally, the memory 228 may enable storing information that may be utilized to configure the FM Rx block 226 and the FM Tx block 232. In this regard, the FM Rx block 226 and/or the FM Tx block 232 may comprise circuitry, logic, and/or code such as a filter, for example, that may be configured based on the desired frequency of operation.

The processor 230 may comprise suitable circuitry, logic, and/or code that may enable interfacing to the memory 228, the frequency synthesizers 224a and 224b, the FM Rx block 226 and/or the FM Tx block 232. In this regard, the processor 230 may be enabled to execute one or more instructions that enable reading and/or writing to/from the memory 228. Additionally, the processor 230 may be enabled to execute one or more instructions that enable providing one or more control signals to the frequency synthesizer 224, the FM Rx block 226, and/or the FM Tx block 232.

The FM Rx block 226 may comprise suitable circuitry, logic, and/or code that may enable reception of FM signals. In this regard, the FM Rx block 226 may be enabled to tune to a desired channel, amplify received signals, down-convert received signals, and/or demodulate received signals to, for example, output data and/or audio information comprising the channel. For example, the FM Rx block 226 may utilize in-phase and quadrature local oscillator signals generated by the frequency synthesizer 224a to down-convert received FM signals. The FM Rx block 226 may, for example, be enabled to operate over the "FM broadcast band", or approximately 76 MHz to 108 Mhz. Signal processing performed by the FM Rx block 226 may be performed in the analog domain or the digital domain. In this regard, the FM Rx block 226 may comprise one or more analog to digital converters (ADCs) and/or digital to analog converters (DACs) which may enable processing in the analog and/or digital domain.

The FM Tx block 232 may comprise suitable circuitry, logic, and/or code that may enable transmission of FM signals. In this regard, the FM Tx block 232 may enable frequency modulation of a carrier signal with audio/data information. In this regard, the carrier frequency may be generated by the clock frequency synthesizer 224b. The FM Tx block 232 may also enable up-converting a modulated signal to a frequency, for example, in the "FM broadcast band", or approximately 76 MHz to 108 Mhz. Additionally, the FM Tx block 232 may enable buffering and/or amplifying a FM signal such that the signal may be transmitted via an antenna. In another embodiment of the invention, the frequency synthesizer 224a may comprise a DDFS that may be capable of providing FM modulation for the signal to be transmitted.

The switch network/coupler 234 may comprise suitable circuitry, logic and or code that may enable coupling the FM Tx block 232 and the FM Rx block 226 to the antenna block 236 for the transmission and reception of wireless signals. In an embodiment of the invention, the antenna block 236 may comprise a plurality of antennas. In this case, the switch network/coupler 234 may couple the FM Tx block 232 and the FM Rx block 226 to the plurality of antennas. The plurality of antennas may comprise internal and externally coupled antennas, or even various metal components within the housing which may contain the radio 200 or even metal components of the housing itself.

In an exemplary operation of the system 200, one or more signals provided by the processor 230 may configure the system 200 to transmit and/or receive FM signals. To receive FM signals, the processor 230 may provide one or more control signals to frequency synthesizers 224a and 224b in order to generate appropriate LO frequencies based on the reference signal $f_{ref}$. In this regard, the processor may interface to the memory 228 in order to determine the appropriate state of any control signals provided to the frequency synthesizers 224a and 224b. In this manner, the transmit frequency and receive frequency may be determined independently. Accordingly, utilizing a transmit frequency different from the receive frequency may enable simultaneous transmission and reception of FM signals.

Figure 4:
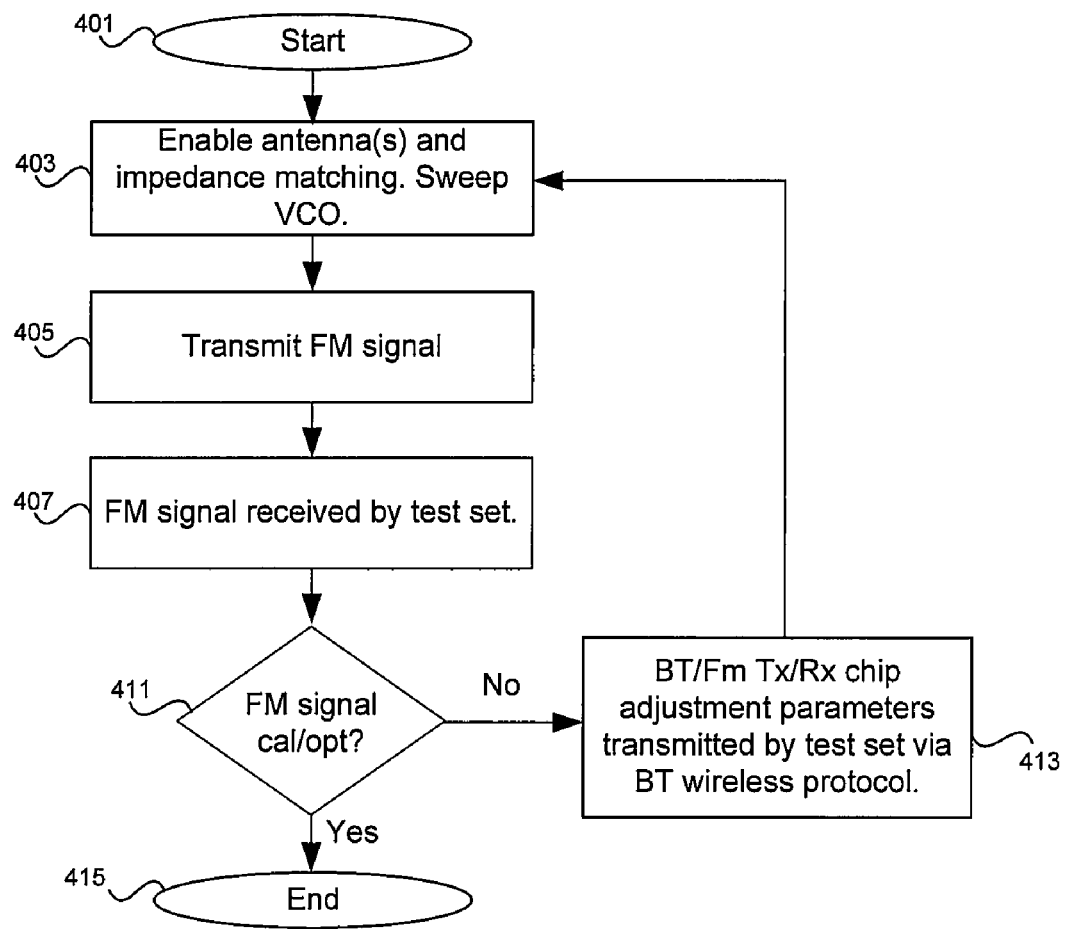
FIG. 4 is a flow diagram illustrating an exemplary wireless device calibration process, in accordance with an embodiment of the invention.

In an embodiment of the invention, the FM Tx block 232 may be calibrated by sweeping the output frequency of the frequency synthesizer 224b over the entire range, and measuring the output signal via an external test system described further with respect to FIG. 4. In addition, by utilizing the Bluetooth or other wireless protocol capability of the mobile terminal 150, described with respect to FIG. 1A, the configuration of the FM Tx block 232 may be adjusted, such as through impedance matching, for example, also described further with respect to FIG. 4. In this manner, the FM Tx block 232 may be calibrated without coupling test equipment or circuitry to the FM Tx block 232, which may affect the performance of the device, skewing the calibration results.

Figure 3:
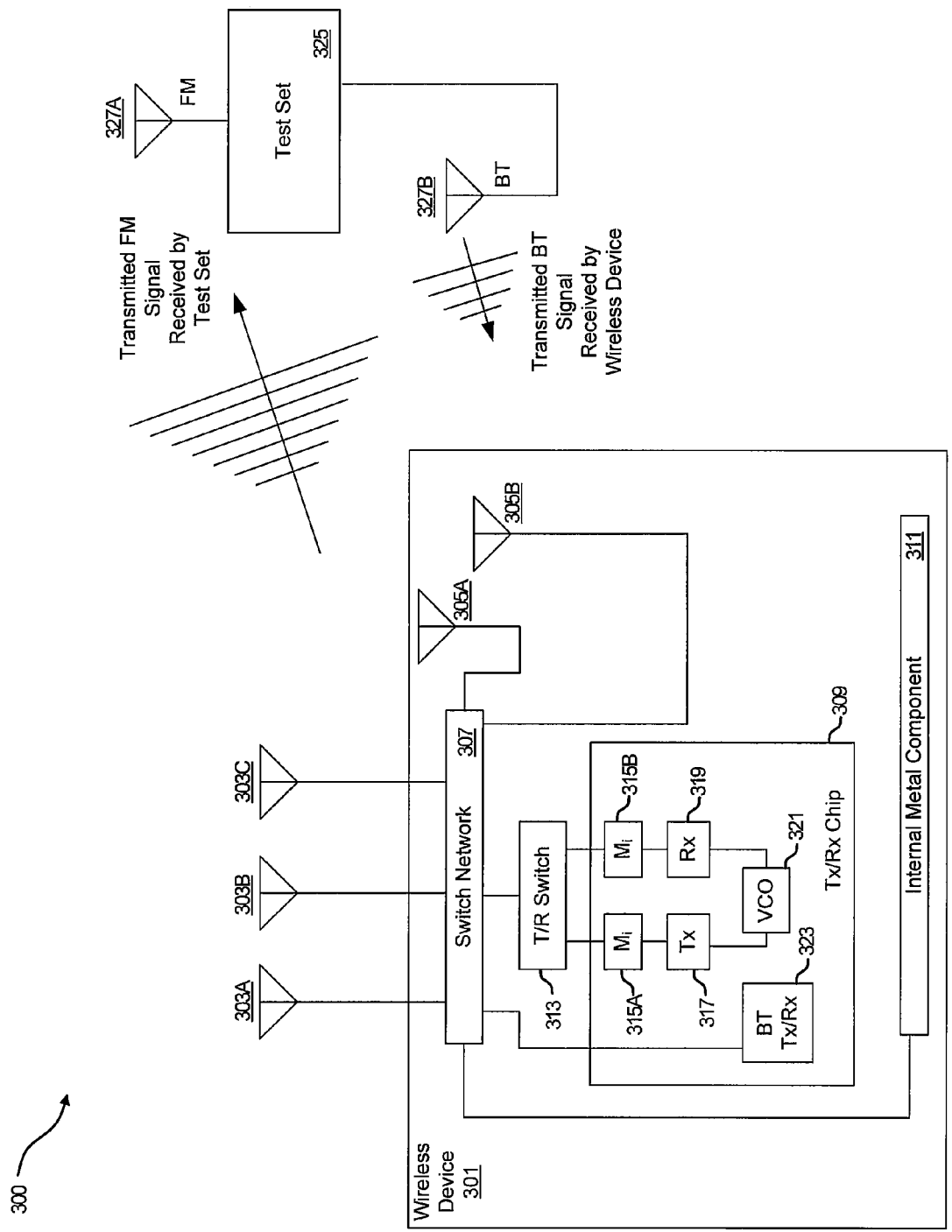
FIG. 3 is a block diagram illustrating an exemplary wireless device antenna calibration system, in accordance with an embodiment of the invention.

FIG. 3 is a block diagram illustrating an exemplary wireless device antenna calibration system, in accordance with an embodiment of the invention. Referring to FIG. 3, there is shown a wireless antenna configuration system 300 comprising a wireless device 301 and a test set 325. The wireless device 301 may comprise external antennas 303A, 303B and 303C, internal antennas 305A and 305B, a switch network 307, a transmit/receive (Tx/Rx) chip 309, a T/R switch 313 and an internal metal component 311. The Tx/Rx chip 309 may comprise on-chip impedance matching blocks 315A and 315B, an FM transmit (Tx) block 317, a voltage-controlled oscillator (VCO) 321, a Bluetooth (BT) Tx/Rx block 323 and an FM receive (Rx) block 319. The test set 325 may comprise an FM antenna 327A and a Bluetooth (BT) antenna 327B.

The external antennas 303A, 303B and 303C may comprise externally coupled antennas that each may be enabled for transmitting and receiving a signal conforming to a particular wireless protocol, such as Bluetooth, WLAN, RFID, and/or FM, for example. The internal antennas 305A and 305B may similarly be enabled for transmitting and receiving a signal conforming to a particular wireless protocol, and may be located internal to the case enclosing the wireless device 301.

The internal metal component 311, may comprise a metal component located within and/or part of the wireless device enclosure, which when coupled to one or more of the antennas may alter the transmit/receive characteristics, such as transmitted and/or received power, for example, of the coupled one or more antennas. The number of antennas or internal metal components may not be limited to the number shown in FIG. 3. Accordingly, the wireless device 301 may comprise any number of antennas as well as any internal metal components that may affect the Tx/Rx characteristics of the system. The internal metal component 311 or components may be utilized in instances where the transmit/receive characteristics may be improved, such as in the transmission and/or reception of FM signals where the increased size of the antenna may increase signal strength.

The switch network 307 may comprise suitable circuitry, logic and/or code that may enable selection of one or more of the antennas and metal components that may be utilized to transmit and receive FM signals. The switch network may be controlled by a processor, such as the processor 230, described with respect to FIG. 2. The switch network 307 may couple one or more of the antennas comprising the external antennas 303A, 303B, 303C, and/or one or more of the internal antennas 305A and 305B, as well as one or more metal components, such as the internal metal component 311 to the T/R switch 313 and/or to the BT Tx/Rx block 323. The internal and external antennas and internal metal component or components may be connected in series or parallel to obtain multiple antenna configurations.

The Tx/Rx chip 309 may comprise suitable circuitry, logic and/or code that may enable transmission and reception of multiple wireless protocol signals. In an exemplary embodiment of the invention, the Tx/Rx chip 309 may comprise FM and BT transmitters and receivers, although the invention need not be so limited. Accordingly, any number of wireless protocol transmitters and receivers may be integrated on-chip, depending on system requirements and/or size of the chip die.

The FM Tx block 317 may comprise suitable circuitry, logic and/or code that may enable transmission of FM signals via the T/R switch 313, the switch network 307 and selected one or more of the external antennas 303A, 303B, 303C, and/or one or more of the internal antennas 305A and 305B. The FM Rx block 319 may comprise suitable circuitry, logic and/or code that may enable reception of FM signals over the same selected antennas. In addition, the switch network 307 may be configured to couple the BT Tx/Rx block 323 to one or more appropriate antennas for transmission and/or reception of Bluetooth signals.

The T/R switch 313 may comprise suitable circuitry, logic and/or code that may enable switching of the selected antenna configuration to be coupled with the FM Tx block 317 and/or the FM Rx block 319. In another embodiment of the invention, in instances where the Tx/Rx chip 309 may be capable of simultaneous FM transmission and reception, as described with respect to FIG. 2, the T/R switch may be enabled to couple both the FM Tx block 317 and the FM Rx block 319 to the selected antenna configuration.

The VCO 321 may comprise suitable circuitry, logic and/or code that may enable generation of a variable frequency output signal that may be utilized by the FM Tx block 317 and the FM Rx block 319 for transmission and reception of FM signals, respectively. The frequency of the output signal may be a function of an input voltage, and may be controlled via a processor, such as the processor 230, described with respect to FIG. 2. In another embodiment of the invention, the VCO 321 may be utilized to clock one or more direct digital frequency synthesizers (DDFSs).

The test set 325 may comprise suitable circuitry, logic and/or code that may be enabled for reception of wireless signals to measure various characteristics of the transmission, such as frequency, signal strength and bandwidth, for example. In an exemplary embodiment of the invention, the test set 325 may be a calibrated system capable of determining FM radio frequency channels according to appropriate standards applicable to the wireless device 301. The test set 325 may comprise the antenna 327A, which may be enabled to receive the FM signals transmitted by a wireless device, such as the wireless device 301. The test set 325 may also comprise the antenna 327B, which may be enabled to transmit and/or receive Bluetooth signals that may be utilized by the wireless device 301 for configuration of the Tx/Rx chip 309 and/or the switch network 307. The configuration may comprise calibration of the VCO 321, adjustment of the impedance matching, or selection of optimum antenna configuration, for example.

In operation, the FM Tx block 317 may be coupled to selected antennas via the T/R switch 313 and the switch network 307. The VCO 321 may be enabled to sweep the frequency of FM transmission via the selected antenna or antennas. The transmitted signal may be received by the test set 325 via the antenna 327A. The test set 325 may be utilized to calibrate the frequency of the FM channels transmitted by the FM Tx block 317. The FM Tx block 317 may be enabled to generate an FM signal to be transmitted by the internal and/or external antennas selected by the switch network 307. The on-chip impedance matching block 315A may be enabled to match the output impedance of the FM Tx 317 to the antennas selected by the switch network 307. The T/R switch 313 may be configured for transmit mode operation, and an impedance within the T/R switch 313 in conjunction with the on-chip impedance match block 315A may also provide impedance match to the antennas selected by the switch network 307.

In an embodiment of the invention, the output frequency of the VCO 321 may be swept across the entire FM frequency range, 70-120 MHz, for example. The test set 325 may be enabled to receive the transmitted FM signal, and to determine characteristics of the signal that may be utilized to optimize the performance of the Tx/Rx chip 309. The test set 325 may also be enabled to transmit data utilizing a different wireless protocol, such as Bluetooth, for example, via the antenna 327B. For example, the test set 325 may determine the frequency of the FM signal transmitted by the wireless device 301 and may transmit data to the wireless device that may indicate that the VCO 321 frequency may need adjustment, or the impedance matching of the FM Tx 317 to the selected antennas may need to be adjusted. The wireless protocol over which the wireless device 301 may receive adjustment parameters may not be limited to Bluetooth. Accordingly, any wireless protocol integrated in the wireless device 301, such as WLAN, RFID and/or near field communication (NFC), for example, may be utilized.

In addition, the signal strength of the FM signal transmitted by the wireless device 301 may be increased by appropriate selection of antennas, such as the external antennas 303A-C, the internal antennas 305A and 305B, or internal metal components, such as the internal metal component 311.

By antenna reciprocity, the calibrated transmitter antenna configuration may also define the calibrated receiver antenna configuration for the FM Rx block 319. As the optimum antenna configuration may change with variations in wireless device 301 design, for example, the integration of the calibration capability may be performed within the Tx/Rx chip 309, as opposed to using externally coupled test fixtures.

In another embodiment of the invention, the plurality of antennas may be utilized to tune the antenna characteristics to a particular frequency range. For example, if two antennas are optimized for 108 MHz and when they may be coupled together, they may be optimized for 76 MHz. They may form a duo band antenna, and by the combination of the two, the range of the antenna may be extended. Since the FM band may comprise a large range, nearly an octave, an antenna may be tuned for the highest frequencies, and then combined with the other antenna to result in another size antenna for a different frequency range.

The wireless protocols integrated in the Tx/Rx chip 309 utilized for impedance matching, antenna configuration, and frequency calibration are not limited to FM. In this regard, any wireless protocol transmitter and receiver integrated in the Tx/Rx chip 309 may be utilized to transmit signals to and receive signals from the test set 325.

FIG. 4 is a flow diagram illustrating an exemplary wireless device calibration process, in accordance with an embodiment of the invention. Referring to FIG. 4, after start step 401, in step 403, the antenna or antennas of the wireless device 301 may be coupled to the FM Tx 317 block 317 via the switch network 307, the T/R switch 313 and the on-chip impedance matching block 315A. The frequency of the VCO 321 may be swept across the frequency range of interest, 70-120 MHz, for example, for the FM broadcast spectrum. In step 405, the FM signal generated by the FM Tx block 317 may be transmitted by one or more of the antennas 303A-C, 305A, 305B, and one or more internal metal components such as the internal metal component 311. In step 407, the test set 325 may receive the transmitted FM signal via the antenna 327A. In step 409, the test set 325 may determine signal characteristics of the received signal, such as frequency, bandwidth and/or signal strength, for example. If the test set 325 may determine that the calibration and/or optimization of the FM transmission may not be complete, the test set 325 may transmit adjustment parameters utilizing the Bluetooth wireless protocol to the wireless device 301 in step 411, and jump back to step 403 to again sweep the VCO 321 frequency. If the test set 325 may determine that the calibration and/or optimization may be complete, the process may step to end step 413.

In an embodiment of the invention, a method and system are disclosed for measuring and optimizing integrated antenna performance and may comprise enabling one or more antennas 303A-C, 305A, 305B and 311 and impedance matching circuits 315A, 315B and 313, varying a frequency of an FM transmitter 317 on a chip 309 while transmitting to an external test set 325 utilizing an oscillator 321 integrated on the chip 309. The FM transmitter 317 may be adjusted via a signal received from the external test set 325 via a different wireless protocol. The adjusting may comprise selecting and/or deselecting one or more of the antennas 303A-C, 305A, 305B and 311 or reconfiguring the impedance matching circuits 315A, 315B and 313. The reconfiguring may comprise selecting one or more capacitors or inductors. The antennas may be internal or external to the wireless device 301, and may be designed for multiple wireless protocols. The antennas may also comprise metal components 311 within and/or part of an enclosure of the wireless device 301. The tunable oscillator 321 may comprise a voltage controlled oscillator or a direct digital frequency synthesizer.

In an embodiment of the invention, a method and system are disclosed for transmitting FM radio signals over a range of frequencies utilizing one or more antenna configurations. The FM radio transmitter 317 may be calibrated based on a signal received by the wireless device 301 via one of the plurality of receivers that utilizes the other wireless protocols. The other wireless protocols may comprise Bluetooth, WiFi, near-field communication (NFC) and RFID, for example. The wireless device 301 may include one or more other corresponding transmitters 323 that utilize other wireless protocols. The transmitted FM radio signals may be received by a test set comprising an FM radio receiver 319 and one or more other corresponding transmitters 323 that utilize other wireless protocols. The signal received at the wireless device 301 via one of the one or more other receivers 323 is generated at the test set 325 via the one or more corresponding transmitters that utilize other wireless protocols. The frequency of the transmitted FM radio signals may be varied over at least a portion of the range of frequencies utilizing a tunable oscillator 321, and the one or more antenna configurations may be varied, based on the variation of the frequency of the transmitted FM radio signals. The antenna configurations may be impedance matched to the FM radio transmitter 317 over the range of frequency of the transmitted FM radio signals by adjusting a capacitive and/or inductive load. The FM radio transmitter 317, FM radio receiver 319 and the tunable oscillator 321 may be integrated within a single chip 309.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for wireless communication, the method comprising:
   in a wireless device comprising a frequency modulation (FM) radio transmitter, an FM radio receiver, and one or more receivers that utilize other wireless protocols:
   transmitting FM radio signals over a range of frequencies utilizing one or more antenna configurations; and
   responsive to said transmitted FM radio signals, calibrating said FM radio transmitter based on a signal received at said wireless device via one of said one or more receivers that utilizes said other wireless protocols.

2. The method according to claim 1, wherein said wireless device comprises one or more other corresponding transmitters that utilize said other wireless protocols.

3. The method according to claim 1, wherein said transmitted FM radio signals are received by a test set comprising an FM radio receiver and one or more other corresponding transmitters that utilize said other wireless protocols.

4. The method according to claim 3, wherein said signal received at said wireless device via one of said one or more receivers that utilizes said other wireless protocols is generated at said test set via said one or more other corresponding transmitters that utilize said other wireless protocols.

5. The method according to claim 1, comprising varying a frequency of said transmitted FM radio signals over at least a portion of said range of frequencies.

6. The method according to claim 5, comprising adjusting said one or more antenna configurations based on said variation of said frequency of said transmitted FM radio signals.

7. The method according to claim 6, comprising matching an impedance of said one or more antenna configurations based on said variation of said frequency of said transmitted FM radio signals.

8. The method according to claim 6, comprising programmably adjusting a capacitive and/or inductive load for said matching of said impedance of said one or more antenna configurations.

9. The method according to claim 5, comprising varying said frequency of said transmitted FM radio signals over said least a portion of said range of frequencies using a tunable oscillator.

10. The method according to claim 9, wherein said frequency modulation (FM) radio transmitter, said FM radio receiver, and said tunable oscillator are integrated within a single chip.

11. A system for wireless communication, the system comprising:
   one or more circuits in a wireless device comprising a frequency modulation (FM) radio transmitter, an FM radio receiver, and one or more receivers that utilize other wireless protocols;
   said one or more circuits transmits FM radio signals over a range of frequencies via one or more antenna configurations; and
   said one or more circuits calibrates said FM radio transmitter based on a signal received at said wireless device via one of said one or more receivers that utilizes said other wireless protocols, responsive to said transmitted FM radio signals.

12. The system according to claim 11, wherein said wireless device comprises one or more other corresponding transmitters that utilize said other wireless protocols.

13. The system according to claim 11, wherein said transmitted FM radio signals are received by a test set comprising an FM radio receiver and one or more other corresponding transmitters that utilize said other wireless protocols.

14. The system according to claim 13, wherein said signal received at said wireless device via one of said one or more receivers that utilizes said other wireless protocols is generated at said test set via said one or more other corresponding transmitters that utilize said other wireless protocols.

15. The system according to claim 11, wherein said one or more circuits varies a frequency of said transmitted FM radio signals over at least a portion of said range of frequencies.

16. The system according to claim 15, wherein said one or more circuits adjusts said one or more antenna configurations based on said variation of said frequency of said transmitted FM radio signals.

17. The system according to claim 16, wherein said one or more circuits matches an impedance of said one or more antenna configurations based on said variation of said frequency of said transmitted FM radio signals.

18. The system according to claim 16, wherein said one or more circuits enable programmable adjustment a capacitive load and/or inductive load for said matching of said impedance of said one or more antenna configurations.

19. The system according to claim 15, wherein said one or more circuits varies said frequency of said transmitted FM radio signals over said least a portion of said range of frequencies using a tunable oscillator.

20. The system according to claim 19, wherein said frequency modulation (FM) radio transmitter, said FM radio receiver, and said tunable oscillator are integrated within a single chip.

21. A machine-readable storage having stored thereon, a computer program having at least one code section for wireless communication, the at least one code section being executable by a machine for causing the machine to perform steps comprising:
in a wireless device comprising a frequency modulation (FM) radio transmitter, an FM radio receiver, and one or more receivers that utilize other wireless protocols:
transmitting FM radio signals over a range of frequencies utilizing one or more antenna configurations; and
responsive to said transmitted FM radio signals, calibrating said FM radio transmitter based on a signal received at said wireless device via one of said one or more receivers that utilizes said other wireless protocols.

22. The machine-readable storage according to claim 21, wherein said wireless device comprises one or more other corresponding transmitters that utilize said other wireless protocols.

23. The machine-readable storage according to claim 21, wherein said transmitted FM radio signals are received by a test set comprising an FM radio receiver and one or more other corresponding transmitters that utilize said other wireless protocols.

24. The machine-readable storage according to claim 23, wherein said signal received at said wireless device via one of said one or more receivers that utilizes said other wireless protocols is generated at said test set via said one or more other corresponding transmitters that utilize said other wireless protocols.

25. The machine-readable storage according to claim 21, wherein said at least one code section comprises code for varying a frequency of said transmitted FM radio signals over at least a portion of said range of frequencies.

26. The machine-readable storage according to claim 25, wherein said at least one code section comprises code for adjusting said one or more antenna configurations based on said variation of said frequency of said transmitted FM radio signals.

27. The machine-readable storage according to claim 26, wherein said at least one code section comprises code for matching an impedance of said one or more antenna configurations based on said variation of said frequency of said transmitted FM radio signals.

28. The machine-readable storage according to claim 26, wherein said at least one code section comprises code for programmably adjusting a capacitive and/or inductive load for said matching of said impedance of said one or more antenna configurations.

29. The machine-readable storage according to claim 25, wherein said at least one code section comprises code for varying said frequency of said transmitted FM radio signals over said least a portion of said range of frequencies using a tunable oscillator.

30. The machine-readable storage according to claim 29, wherein said frequency modulation (FM) radio transmitter, said FM radio receiver, and said tunable oscillator are integrated within a single chip.

* * * * *